United States Patent
Shiraishi

(10) Patent No.: US 10,651,856 B2
(45) Date of Patent: May 12, 2020

(54) FOUR-PHASE OSCILLATOR AND CDR CIRCUIT

(71) Applicant: FUJITSU LIMITED, Kawasaki-shi, Kanagawa (JP)

(72) Inventor: Takashi Shiraishi, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/992,245

(22) Filed: May 30, 2018

(65) Prior Publication Data

US 2018/0351559 A1    Dec. 6, 2018

(30) Foreign Application Priority Data

Jun. 1, 2017  (JP) .................................. 2017-109477

(51) Int. Cl.
*H03B 5/12* (2006.01)
*H03B 27/00* (2006.01)
(Continued)

(52) U.S. Cl.
CPC ........... *H03L 7/0807* (2013.01); *H03B 5/124* (2013.01); *H03B 5/1215* (2013.01);
(Continued)

(58) Field of Classification Search
CPC .. H03B 5/1206; H03B 5/1209; H03B 5/1212; H03B 5/1215; H03B 5/1225;
(Continued)

(56) References Cited

U.S. PATENT DOCUMENTS 6,750,727 B1 * 6/2004 Sutardja .............. H03B 5/1228
                                                    330/253
7,075,377 B2 * 7/2006 Metaxakis ............. H03B 27/00
                                                    331/117 R
(Continued)

FOREIGN PATENT DOCUMENTS

WO    2007/072549    6/2007

OTHER PUBLICATIONS

A. Pottbäcker, et al., "A Si Bipolar Phase and Frequency Detector IC for Clock Extraction up to 8 Gb/s", IEEE Journal of Solid-State Circuits, vol. 27, No. 12, pp. 1747-1751, Dec. 1992 (5 pages).

*Primary Examiner* — Levi Gannon
(74) *Attorney, Agent, or Firm* — Fujitsu Patent Center

(57) ABSTRACT

A four-phase oscillator includes, a first oscillator configured to output a first differential signal, a second oscillator configured to output a second differential signal shifted in phase with respect to the first differential signal by 90 or −90 degrees, and a control circuit. The first oscillator includes a first tail current source and a second tail current source. The second oscillator includes a third tail current source and a fourth tail current source. The control circuit changes the frequency of the first and second differential signals by controlling at least one of a difference between a first current value supplied from the first tail current source and a third current value supplied from the third tail current source and a difference between a second current value supplied from the second tail current source and a fourth current value supplied from the fourth tail current source.

9 Claims, 12 Drawing Sheets

(51) Int. Cl.
*H03L 7/087* (2006.01)
*H03L 7/08* (2006.01)
*H03B 5/24* (2006.01)
*H03B 5/18* (2006.01)
*H03L 7/093* (2006.01)
*H03L 7/099* (2006.01)
*H03L 7/089* (2006.01)

(52) U.S. Cl.
CPC ......... *H03B 5/1225* (2013.01); *H03B 5/1228* (2013.01); *H03B 5/1271* (2013.01); *H03B 5/18* (2013.01); *H03B 5/24* (2013.01); *H03B 27/00* (2013.01); *H03L 7/087* (2013.01); *H03L 7/0891* (2013.01); *H03L 7/093* (2013.01); *H03L 7/099* (2013.01); *H03B 2200/0078* (2013.01)

(58) Field of Classification Search
CPC .... H03B 5/1228; H03B 5/124; H03B 5/1271; H03B 27/00; H03B 2200/0078; H03K 3/0315; H03K 3/0322; H03K 3/354; H03L 7/0807; H03L 7/087; H03L 7/0891; H03L 7/093; H03L 7/099
USPC .......................................................... 331/57
See application file for complete search history.

(56) References Cited

U.S. PATENT DOCUMENTS

| | | | |
|---|---|---|---|
| 7,146,140 B2 * | 12/2006 | Ravi | H03B 5/14 455/146 |
| 8,258,887 B1 * | 9/2012 | Nedovic | H03B 27/00 327/238 |
| 9,484,858 B1 * | 11/2016 | Kalia | H03B 27/00 |
| 2002/0093385 A1 * | 7/2002 | Nishiyama | H03B 27/00 331/46 |
| 2004/0169561 A1 * | 9/2004 | Cho | H03B 27/00 331/46 |
| 2004/0251975 A1 * | 12/2004 | Li | H03B 27/00 331/46 |
| 2008/0042754 A1 * | 2/2008 | Chen | H03B 27/00 331/2 |
| 2008/0252387 A1 | 10/2008 | Higashi | |
| 2009/0208226 A1 * | 8/2009 | Gao | H03L 7/089 398/202 |
| 2012/0032745 A1 * | 2/2012 | Nedovic | H03B 5/1228 331/48 |
| 2012/0081155 A1 * | 4/2012 | Li | H03B 19/00 327/105 |
| 2018/0351510 A1 * | 12/2018 | Xue | H03B 5/1228 |

* cited by examiner

FOUR-PHASE OSCILLATOR AND CDR CIRCUIT

CROSS-REFERENCE TO RELATED APPLICATION

This application is based upon and claims the benefit of priority of the prior Japanese Patent Application No. 2017-109477, filed on Jun. 1, 2017, the entire contents of which are incorporated herein by reference.

FIELD

The embodiments discussed herein are related to a four-phase oscillator and a clock and data recovery (CDR) circuit.

BACKGROUND

A conventionally known four-phase oscillator outputs clock signals of four phases different from each other using LC resonance of an LC resonator including an inductor (L) and a capacitor (C) coupled in parallel. Four-phase oscillators are used in CDR circuits included in a reception circuit that receives data in the field of high-speed interconnects that allow wired or wireless high speed communication of data. CDR circuits regenerate clock signals and data from received data signals with the clock signals superimposed thereon.

Related techniques are disclosed in, for example, International Publication Pamphlet No. WO2007/072549.

SUMMARY

According to an aspect of the embodiments, a four-phase oscillator includes, a first oscillator configured to output a first differential signal, a second oscillator configured to output a second differential signal shifted in phase with respect to the first differential signal by 90 or −90 degrees, and a control circuit. The first oscillator includes, a first resonator including an inductor and a capacitor coupled in parallel, a first cross-coupled circuit in which a first pair of transistors coupled to the first resonator are cross-coupled, a first tail current source coupled to the first pair of transistors, first input differential pair transistors configured to receive the second differential signal, and a second tail current source coupled to the first input differential pair transistors. The second oscillator includes, a second resonator including an inductor and a capacitor coupled in parallel, a second cross-coupled circuit in which a second pair of transistors coupled to the second resonator are cross-coupled, a third tail current source coupled to the second pair of transistors, second input differential pair transistors configured to receive the first differential signal, and a fourth tail current source coupled to the second input differential pair transistors. The control circuit changes the frequency of the first and second differential signals by controlling at least one of a difference between a first current value supplied from the first tail current source and a third current value supplied from the third tail current source and a difference between a second current value supplied from the second tail current source and a fourth current value supplied from the fourth tail current source.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

The oscillation frequency range of a four-phase oscillator could be increased by expanding the variable range (the range in which the capacitance is variable) of a variable capacitor in an LC resonator. A plurality of oscillation frequencies (25 and 28 GHz or 32 and 36 GHz, for example) are provided by such a four-phase oscillator with the variable range of the variable capacitor expanded without preparing a plurality of four-phase oscillators for the respective frequencies.

However, when the capacitance value of the variable capacitor is increased, the quality factor (Q factor) representing the performance of the LC resonator decreases, and clock signals will include large noise, for example. In addition, if the variable capacitor is increased in size in order to increase the capacitance value of the variable capacitor, the parasitic capacitance thereof becomes not negligible, and the oscillation frequency range decreases.

The disclosure provides a four-phase oscillator that allows for reduction of a decrease in the Q factor and expansion of the oscillation frequency range and a CDR circuit including the four-phase oscillator.

Hereinafter, a four-phase oscillator and a CDR circuit according to the disclosure will be described with reference to the drawings.

Figure 1:
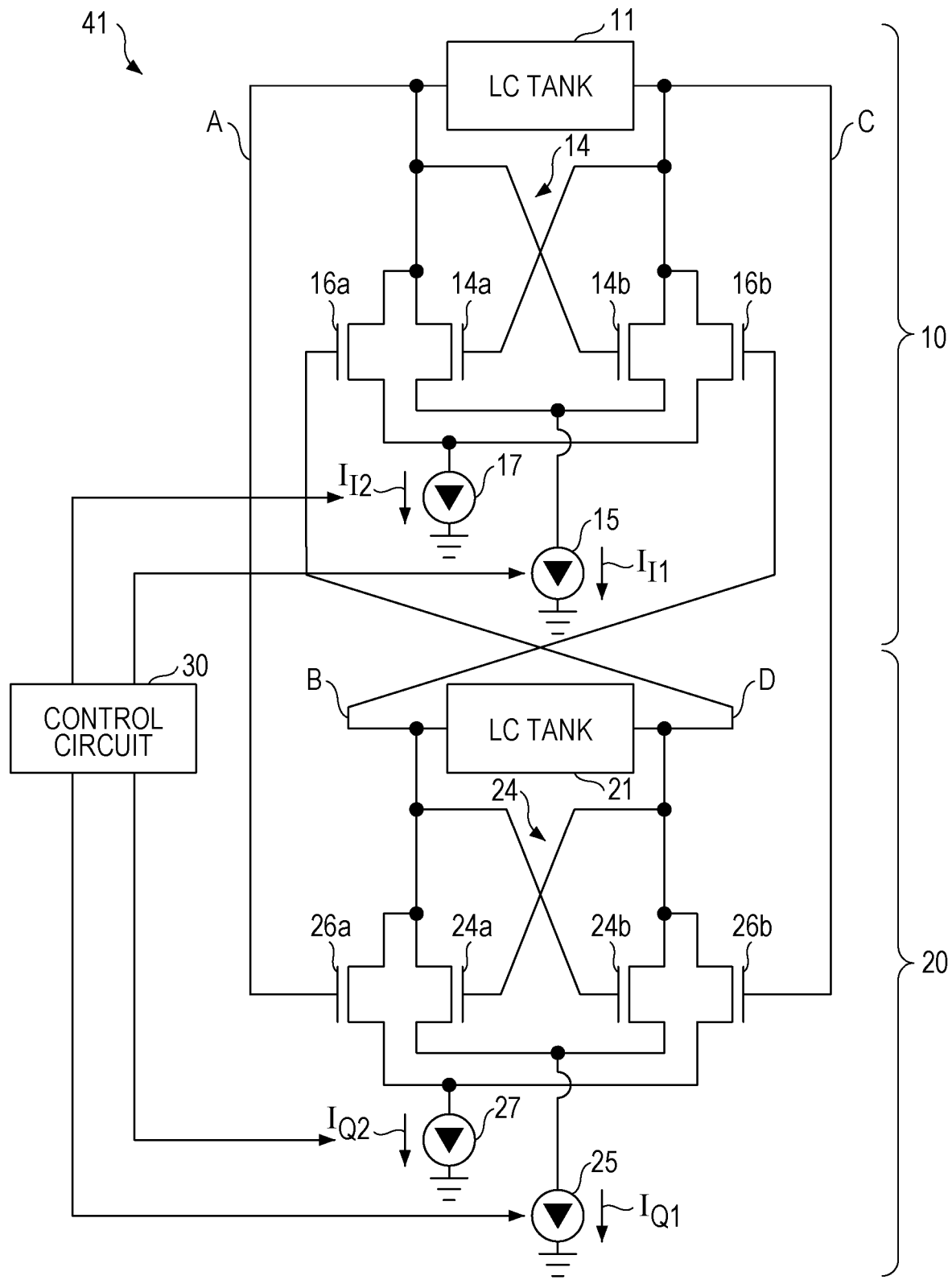
FIG. 1 is a diagram illustrating an example of the configuration of a four-phase oscillator according to the disclosure.

FIG. 1 is a diagram illustrating an example of the configuration of a four-phase oscillator according to the disclosure. A four-phase oscillator 41 illustrated in FIG. 1 includes an I-phase oscillator 10, a Q-phase oscillator 20, and a control circuit 30. The I-phase oscillator 10 is an example of a first oscillator configured to output a first differential signal with a phase difference of 180 degrees. The Q-phase oscillator 20 is an example of a second oscillator configured to output a second differential signal with phases shifted from the first differential signal by 90 or −90 degrees.

The I-phase oscillator 10 includes an LC tank 11, a cross-coupled circuit 14, a tail current source 15, first input differential pair transistors 16a and 16b, and a tail current source 17.

The LC tank 11 is an example of a first resonator including an inductor and a capacitor coupled in parallel. The cross-coupled circuit 14 is an example of a first cross-coupled circuit. The cross-coupled circuit 14 has a structure in which a pair of transistors 14a and 14b coupled to the LC tank 11 are cross-coupled. The pair of transistors 14a and 14b is an example of a first pair of transistors. The tail current source 15 is an example of a first tail current source. The tail current source 15 is coupled to the pair of transistors 14a and 14b. The first input differential pair transistors 16a and 16b are configured to receive the second differential signal. The tail current source 17 is an example of a second tail current source and is coupled to the first input differential pair transistors 16a and 16b.

The Q-phase oscillator 20 includes an LC tank 21, a cross-coupled circuit 24, a tail current source 25, second input differential pair transistors 26a and 26b, and a tail current source 27.

The LC tank 21 is an example of a second resonator including an inductor and a capacitor coupled in parallel. The cross-coupled circuit 24 is an example of a second cross-coupled circuit. The cross-coupled circuit 24 has a structure in which a pair of transistors 24a and 24b coupled to the LC tank 21 are cross-coupled. The pair of transistors 24a and 24b is an example of a second pair of transistors. The tail current source 25 is an example of a third tail current source. The tail current source 25 is coupled to the pair of transistors 24a and 24b. The second input differential pair transistors 26a and 26b are configured to receive the first differential signal. The tail current source 27 is an example of a fourth tail current source and is coupled to the second input differential pair transistors 26a and 26b.

The first input differential pair transistors 16a and 16b are coupled in parallel to the first pair of transistors 14a and 14b, respectively. The second input differential pair transistors 26a and 26b are coupled in parallel to the second pair of transistors 24a and 24b, respectively.

The I-phase oscillator 10 includes a pair of output terminals A and C that output the first differential signal. The Q-phase oscillator 20 a pair of output terminals B and D that output the second differential signal. The LC tank 11 is coupled between the first output terminal A and the second output terminal C. The LC tank 21 is coupled between the third output terminal B and the fourth output terminal D.

The first pair of transistors are transistors for oscillation including the first transistor 14a, which is coupled to the first output terminal A, and the second transistor 14b, which is coupled to the second output terminal C. The gate of the first transistor 14a is coupled to the second output terminal C; the drain thereof is coupled to the first output terminal A; and the source thereof is coupled to the tail current source 15. The gate of the second transistor 14b is coupled to the first output terminal A; the drain thereof is coupled to the second output terminal C; and the source thereof is coupled to the tail current source 15.

The tail current source 15 supplies a first current value $I_{r1}$ to the pair of transistors 14a and 14b of the cross-coupled circuit 14. The first current value $I_{r1}$ indicates a current value of tail current for oscillation. The tail current source 15 is coupled between the common connection point of the sources of the pair of transistors 14a and 14b and the ground.

The first input differential pair transistors include: the third transistor 16a, which is coupled in parallel to the first transistor 14a and is coupled to the fourth output terminal D, and the fourth transistor 16b, which is coupled in parallel to the second transistor 14b and is coupled to the third output terminal B. The first input differential pair transistors represent transistors for injection. The gate of the third transistor 16a is coupled to the fourth output terminal D; the drain thereof is coupled to the first output terminal A; and the source thereof is coupled to the tail current source 17. The gate of the fourth transistor 16b is coupled to the third output terminal B; the drain thereof is coupled to the second output terminal C; and the source thereof is coupled to the tail current source 17.

The tail current source 17 supplies a second current value $I_{r2}$ to the pair of transistors 16a and 16b. The second current value $I_{r2}$ indicates the current value of tail current for injection. The tail current source 17 is coupled between the common connection point of the sources of the pair of transistors 16a and 16b and the ground.

The second pair of transistors are transistors for oscillation including: the fifth transistor 24a, which is coupled to the third output terminal B; and the sixth transistor 24b, which is coupled to the fourth output terminal D. The gate of the fifth transistor 24a is coupled to the fourth output terminal D; the drain thereof coupled to the third output terminal B; and the source thereof is coupled to the tail current source 25. The gate of the sixth transistor 24b is coupled to the third output terminal B; the drain thereof is coupled to the fourth output terminal D; and the source thereof is coupled to the tail current source 25.

The tail current source 25 supplies a third current value $I_{Q1}$ to the pair of transistors 24a and 24b of the cross-coupled circuit 24. The third current value $I_{Q1}$ represents the current value of the tail current for oscillation. The tail current source 25 is coupled between the common connection point of the sources of the pair of transistors 24a and 24b and the ground.

The second input differential pair transistors include: the seventh transistor 26a, which is coupled in parallel to the fifth transistor 24a and is coupled to the first output terminal A, and the eighth transistor 26b, which is coupled in parallel to the sixth transistor 24b and is coupled to the second output terminal C. The second input differential pair transistors represent transistors for injection. The gate of the seventh transistor 26a is coupled to the first output terminal A; the drain thereof is coupled to the third output terminal B; and the source thereof is coupled to the tail current source 27. The gate of the eighth transistor 26b is coupled to the second output terminal C; the drain thereof is coupled to the fourth output terminal D; and the source thereof is coupled to the tail current source 27.

The tail current source 27 supplies a fourth current value $I_{Q2}$ to the pair of transistors 26a and 26b. The fourth current value $I_{Q2}$ represents the current value of tail current for injection. The tail current source 27 is coupled between the common connection point of the sources of the pair of transistors 26a and 26b and the ground.

Each of the transistors 14a, 14b, 16a, 16b, 24a, 24b, 26a, and 26b is an N-channel metal oxide semiconductor field effect transistor (MOSFET). Each of these transistors may be an npn-type bipolar transistor. In this case, the gate, drain, and source correspond to the base, collector, and emitter, respectively.

Figure 2:
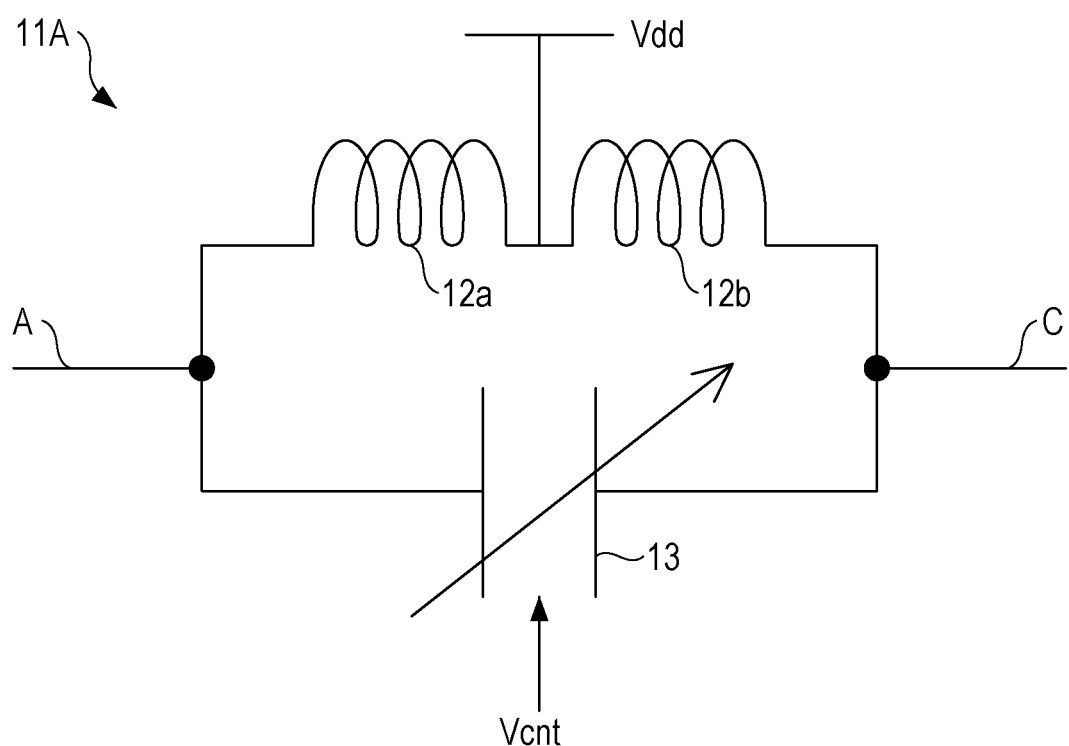
FIG. 2 is a diagram illustrating an example of the configuration of an oscillator.

FIG. 2 is a diagram illustrating a configuration example of resonators. An LC tank 11A is an example of the LC tank 11 illustrated in FIG. 1. The LC tank 11A includes a configuration in which an inductor 12 and a capacitor 13 are coupled in parallel. The inductor 12 includes an inductor 12a and an inductor 12b and is coupled to a supply line of a supply voltage Vdd between the inductors 12a and 12b. The output terminal A is coupled to Vdd through the inductor 12a, and the output terminal C is coupled to the supply line of the supply voltage Vdd through the inductor 12b. The capacitor 13 is a variable capacitor with the capacitance value varying with control voltage Vcnt, for example. Specific examples of the capacitor 13 include a varactor diode and a variable capacitance diode. The LC tank 21 illustrated in FIG. 1 includes the same configuration as that illustrated in FIG. 2.

Figure 3:
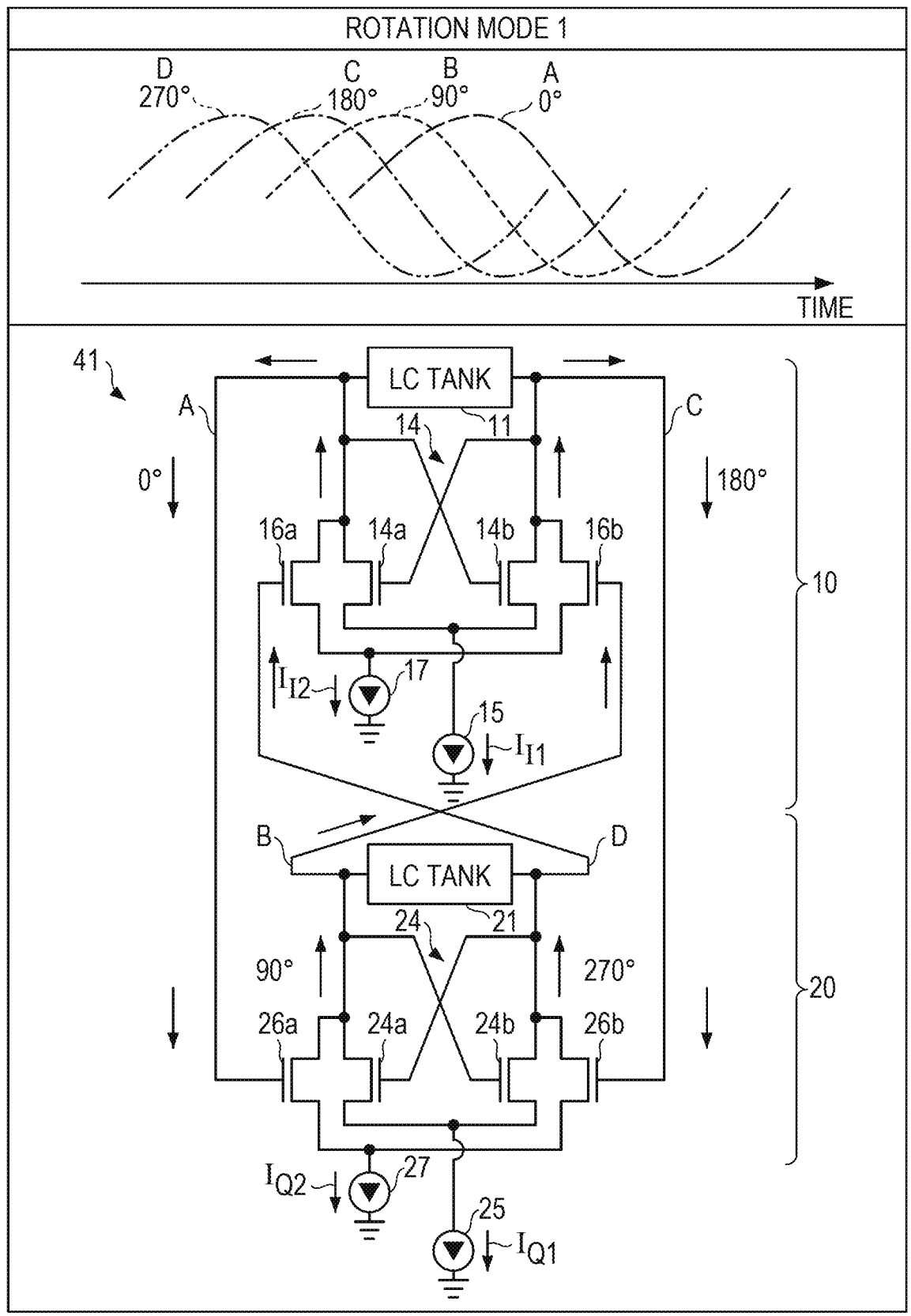
FIG. 3 is a diagram illustrating an example of a first oscillation mode of the four-phase oscillator.
Figure 4:
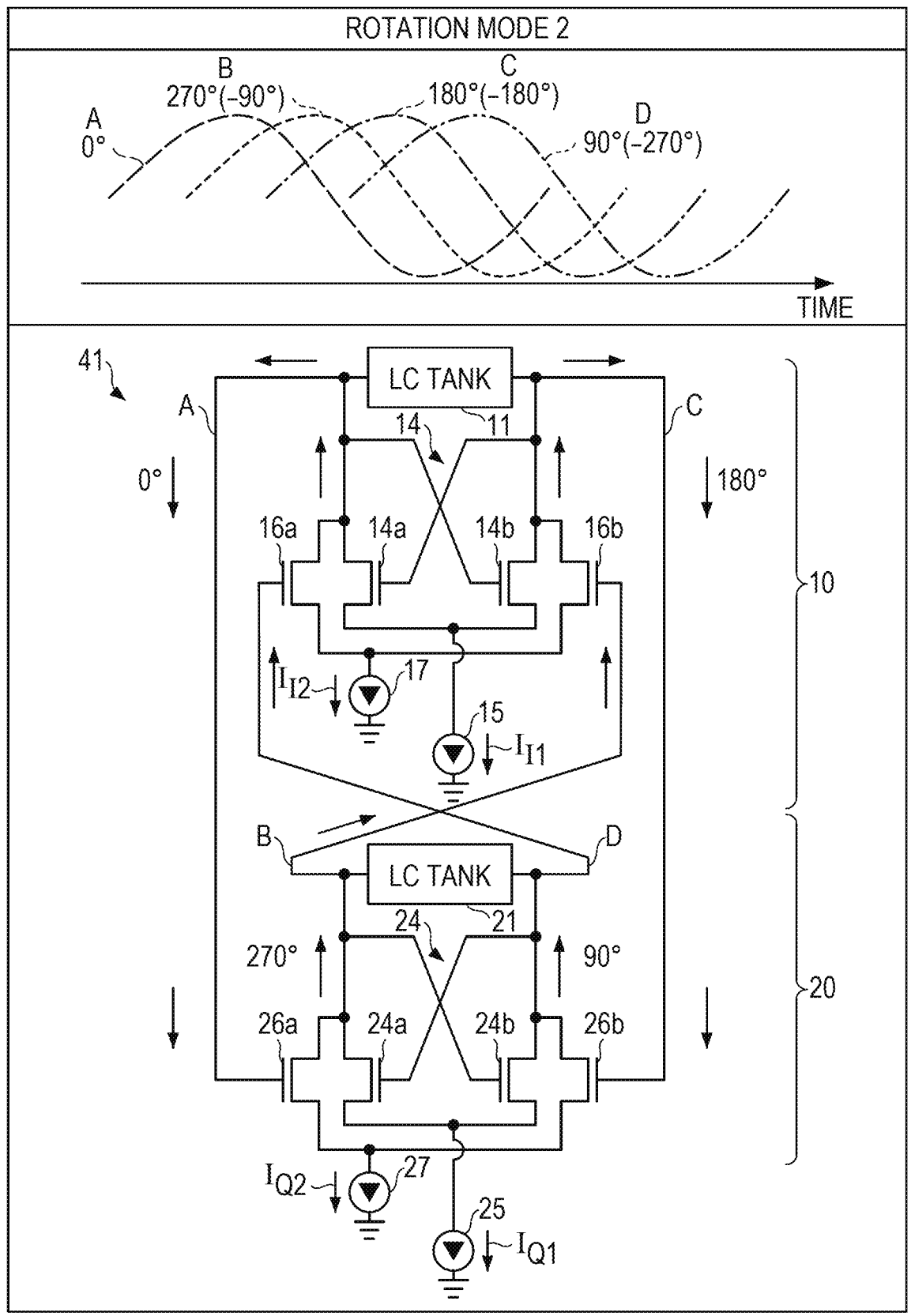
FIG. 4 is a diagram illustrating an example of a second oscillation mode of the four-phase oscillator.

FIG. 3 is a diagram illustrating an example of a first oscillation mode of a four-phase oscillator according to the disclosure. FIG. 4 is a diagram illustrating an example of a second oscillation mode of the four-phase oscillator according to the disclosure. The four-phase oscillator 41 configured as illustrated in FIGS. 3 and 4 may take two types of oscillation modes (rotation modes).

FIG. 3 is described sequentially in the order of inputs and outputs of clock voltage signal, starting from the output terminal A. 0-degree clock signal outputted from the output terminal A is injected into the transistor 26a of the Q-phase oscillator 20, and 90-degree clock signal which leads the 0-degree clock signal in phase by 90 degrees is outputted from the output terminal B. The 90-degree clock signal outputted from the output terminal B is injected into the transistor 16b of the I-phase oscillator 10, and 180-degree clock signal which leads the 90-degree clock signal in phase by 90 degrees is outputted from the output terminal C. The 180-degree clock signal outputted from the output terminal C is injected into the transistor 26b of the Q-phase oscillator 20, and 270-degree clock signal which leads the 180-degree clock signal in phase by 90 degrees is outputted from the output terminal D. The 270-degree clock signal outputted from the output terminal D is injected into the transistor 16a of the I-phase oscillator 10, and 0-degree clock signal which leads the 270-degree clock signal in phase by 90 degrees is outputted form the output terminal A.

FIG. 4 is described sequentially in the order of inputs and outputs of clock voltage signal, starting from the output terminal A. 0-degree clock signal outputted from the output terminal A is injected into the transistor 26a of the Q-phase oscillator 20, and 270-degree clock signal which lags behind the 0-degree clock signal in phase by 90 degrees is outputted from the output terminal B. The 270-degree clock signal outputted from the output terminal B is injected into the transistor 16b of the I-phase oscillator 10, and 180-degree clock signal which lags behind the 270-degree clock signal in phase by 90 degrees is outputted from the output terminal C. The 180-degree clock signal outputted from the output terminal C is injected into the transistor 26b of the Q-phase oscillator 20, and 90-degree clock signal which lags behind the 180-degree clock signal in phase by 90 degrees is outputted from the output terminal D. The 90-degree clock signal outputted from the output terminal D is injected into the transistor 16a of the I-phase oscillator 10, and 0-degree clock signal which lags behind the 90-degree clock signal in phase by 90 degrees is outputted form the output terminal A.

Figure 5:
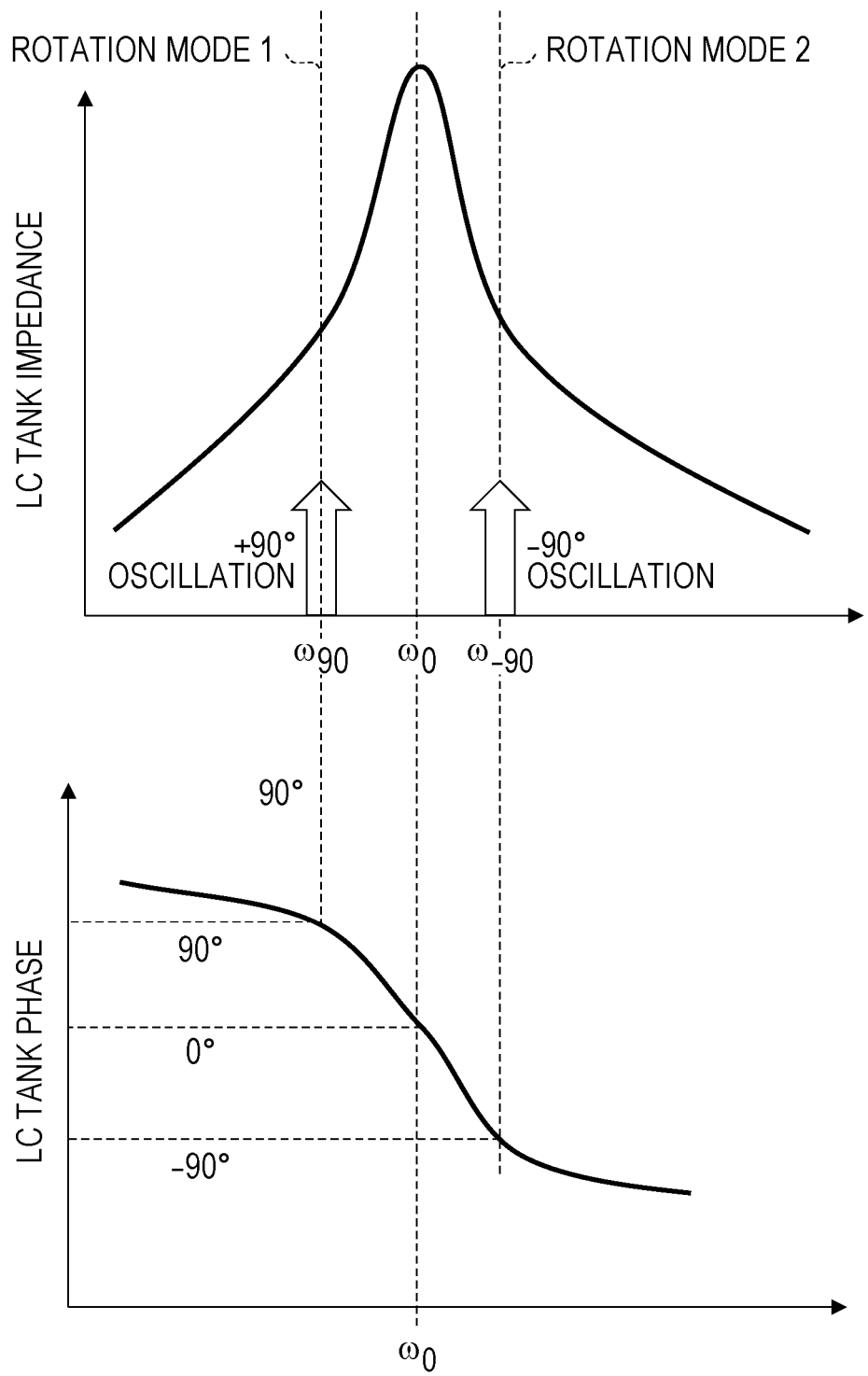
FIG. 5 is a diagram illustrating an example of variation in oscillation frequency.

Herein, these rotation modes will be considered in terms of oscillation frequency, the four-phase oscillator 41, which has the configuration illustrated in the FIGS. 3 and 4, oscillates at oscillation frequencies shifted from a design oscillation frequency $\omega_0$, that corresponds to the resonant frequency of the LC tanks, in the rotation modes 1 and 2 (see FIG. 5). The four-phase oscillator 41 oscillates at different frequencies in the rotation modes 1 and 2. In the rotation mode 1, the four-phase oscillator 41 oscillates at a resonant frequency $\omega_{90}$, which is lower than the design oscillation frequency $\omega_0$. In the rotation mode 2, the four-phase oscillator 41 oscillates at a resonant frequency $\omega_{-90}$, which is higher than the design oscillation frequency $\omega_0$.

The four-phase oscillator 41 therefore includes a control circuit 30 (see FIG. 1) that controls switching between the two rotation modes using such a shift of the resonant frequency between the two rotation modes. The control circuit 30 switches the rotation modes of the four-phase oscillator 41 to change the oscillation frequency of the clock signals of four phases (0, 90, 180, and 270 degrees) outputted from the four-phase oscillator 41. The switching function of the control circuit 30 may be implemented by a logical circuit or may be implemented by a processor processing a program.

(First Embodiment)

In FIG. 1, the control circuit 30 individually controls the tail current $I_I$ of the I-phase oscillator 10 and the tail current $I_Q$ of the Q-phase oscillator 20 for switching the rotation mode of the four-phase oscillator 41. In order to switch the rotation mode of the four-phase oscillator 41, the I-phase oscillator 10 and Q-phase oscillator 20 are configured to have different resonant frequencies from each other. The components of the I-phase oscillator 10 and Q-phase oscillator 20 are laid out asymmetrically, for example.

The inductance and capacitance of at least one of the LC tanks 11 and 21 are adjusted so that the resonant frequency at which the LC tank 11 resonates is different from the resonant frequency at which the LC tank 21 resonates, for example. By adjusting the LC constant of each LC tank, the resonant frequencies of the I-phase oscillator 10 and Q-phase oscillator 20 are easily made different from each other. The I-phase oscillator 10 and Q-phase oscillator 20 may be designed to have different resonant frequencies by using transistors of different sizes or making wire capacitances different.

The control circuit 30 controls at least one of the difference between the first current value $I_{I1}$, which is supplied by the tail current source 15, and the third current value $I_{Q1}$, which is supplied by the tail current source 25, and the difference between the second current value $I_{I2}$, which is supplied by the tail current source 17, and the fourth current value $I_{Q2}$, which is supplied by the tail current source 27. By performing the above control, the control circuit 30 changes the frequency of the first and second differential signals. The first differential signals represent the aforementioned clock signals outputted from the paired output terminals A and C, and the second differential signals represent the aforementioned clock signals outputted from the paired output terminals B and D.

The control circuit 30 sets the tail current value of one of the LC tanks 11 and 21 that has a higher resonant frequency, higher than the tail current value of the other tank to increase the frequency of the first and second differential signals.

When the resonant frequency of the LC tank 11 is higher than that of the LC tank 21, the control circuit 30 sets the first current value $I_{I1}$ higher than the third current value $I_{Q1}$ and sets the second current value $I_{I2}$ higher than the fourth current value $I_{Q2}$. The oscillation mode of the four-phase oscillator 41 is thereby switched to the rotation mode 2, so that the frequency of the first and second differential signals increases (see FIG. 5). On the other hand, when the resonant frequency of the LC tank 11 is higher than that of the LC tank 21, the control circuit 30 sets the first current value $I_{r1}$ lower than the third current value $I_{Q1}$ and sets the second current value $I_{r2}$ lower than the fourth current value $I_{Q2}$. The oscillation mode of the four-phase oscillator 41 is thereby switched to the rotation mode 1, so that the frequency of the first and second differential signals decrease (see FIG. 5).

When the resonant frequency of the LC tank 11 is lower than that of the LC tank 21, the control circuit 30 sets the first current value $I_{r1}$ lower than the third current value $I_{Q1}$ and sets the second current value $I_{r2}$ lower than the fourth current value $I_{Q2}$. The oscillation mode of the four-phase oscillator 41 is thereby switched to the rotation mode 2, so that the frequency of the first and second differential signals increases (see FIG. 5). On the other hand, when the resonant frequency of the LC tank 11 is lower than that of the LC tank 21, the control circuit 30 sets the first current value $I_{r1}$ higher than the third current value $I_{Q1}$ and sets the second current value $I_{r2}$ higher than the fourth current value $I_{Q2}$. The oscillation mode of the four-phase oscillator 41 is thereby switched to the rotation mode 1, so that the frequency of the first and second differential signals degreases (see FIG. 5).

Figure 6:
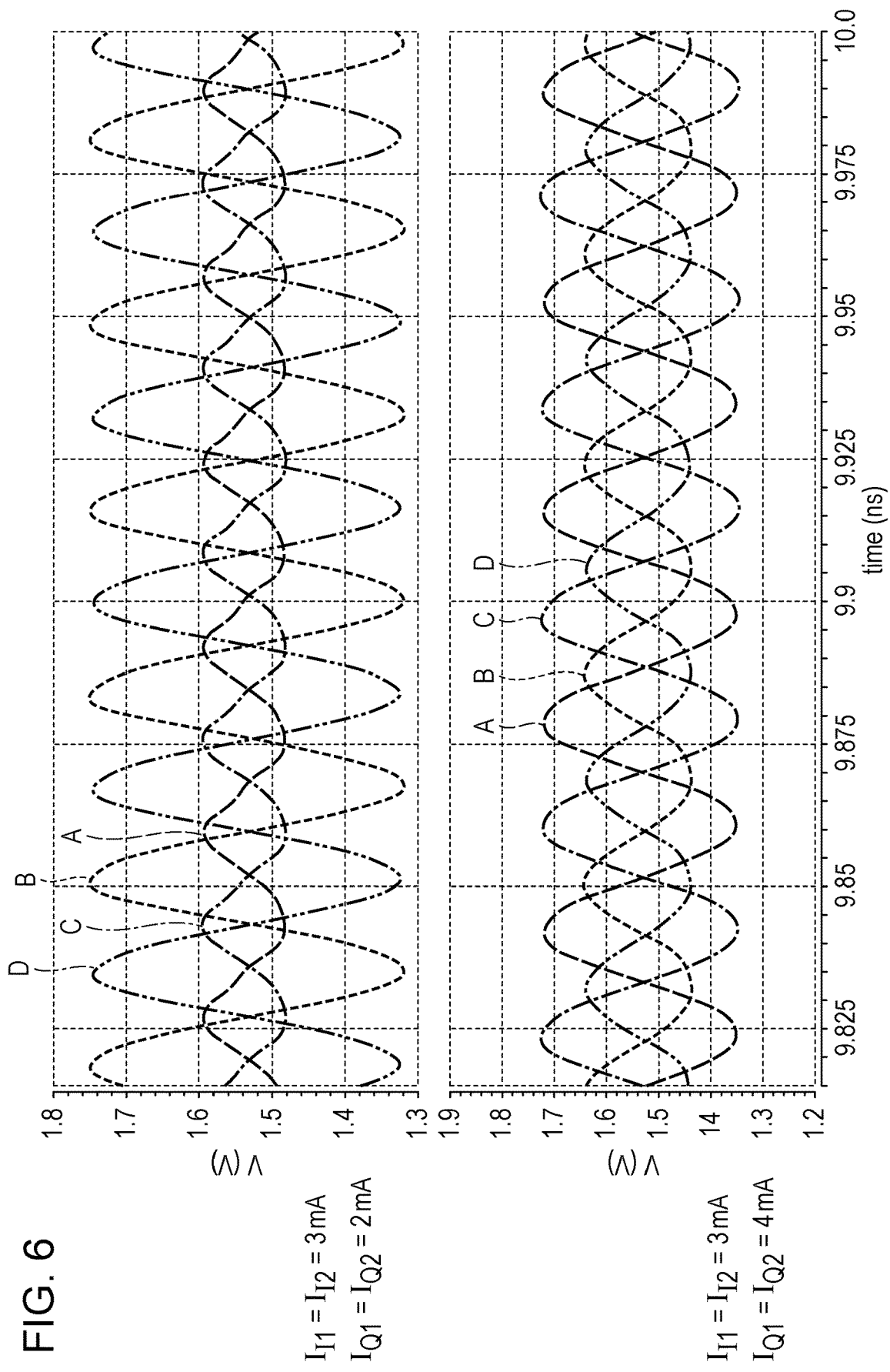
FIG. 6 is a time chart illustrating examples of changes in frequency of first and second differential signals outputted from the four-phase oscillator according to a first embodiment.

FIG. 6 illustrates examples of waveforms obtained by varying the tail current values in the first embodiment when the resonant frequency of the first resonator is higher than that of the second resonator. The upper diagram of FIG. 6 illustrates waveforms in the rotation mode 2 in which the four-phase oscillator oscillates at 30.6 GHz. The lower diagram of FIG. 6 illustrates waveforms in the rotation mode 1 in which the four-phase oscillator oscillates at 27 GHz. The difference in frequency between the rotation modes 1 and 2 is 3.6 GHz. According to the four-phase oscillator of the disclosure, the four-phase oscillator is capable of addressing a plurality of oscillation frequencies alone in such a manner, allowing for reduction of a decrease in the Q factor and expansion of the oscillation frequency range.

(Second Embodiment)

In FIG. 1, the control circuit 30 switches the rotation mode of the four-phase oscillator 41 by individually controlling the tail current $I_2$ of the transistor for injection and the tail current $I_1$ for oscillation in each of the I-phase oscillator 10 and Q-phase oscillator 20. In a second embodiment, the resonant frequency at which the LC tank 11 resonates may be the same as or different from the resonant frequency at which the LC tank 21 resonates.

The control circuit 30 controls at least one of the difference between the first current value $I_{r1}$, which is supplied by the tail current source 15, and the second current value $I_{r2}$, which is supplied by the tail current source 17, and the difference between the third current value $I_{Q1}$, which is supplied by the tail current source 25, and the fourth current value $I_{Q2}$, which is supplied by the tail current source 27. The control circuit 30 performs the above control to change the frequency of the first and second differential signals. The first differential signals represent the aforementioned clock signals outputted from the paired output terminals A and C, and the second differential signals represent the aforementioned clock signals outputted from the paired output terminals B and D.

The control circuit 30 performs at least one of setting the first current value $I_{r1}$ higher than the second current value $I_{r2}$ and setting the third current value $I_{Q1}$ higher than the fourth current value $I_{Q2}$. The frequency of the first and second differential signals is thereby reduced. On the other hand, the control circuit 30 performs at least one of setting the second current value $I_{r2}$ higher than the first current value $I_{r1}$ and setting the fourth current value $I_{Q2}$ higher than the third current value $I_{Q1}$. The frequency of the first and second differential signals is thereby increased.

Figure 7:
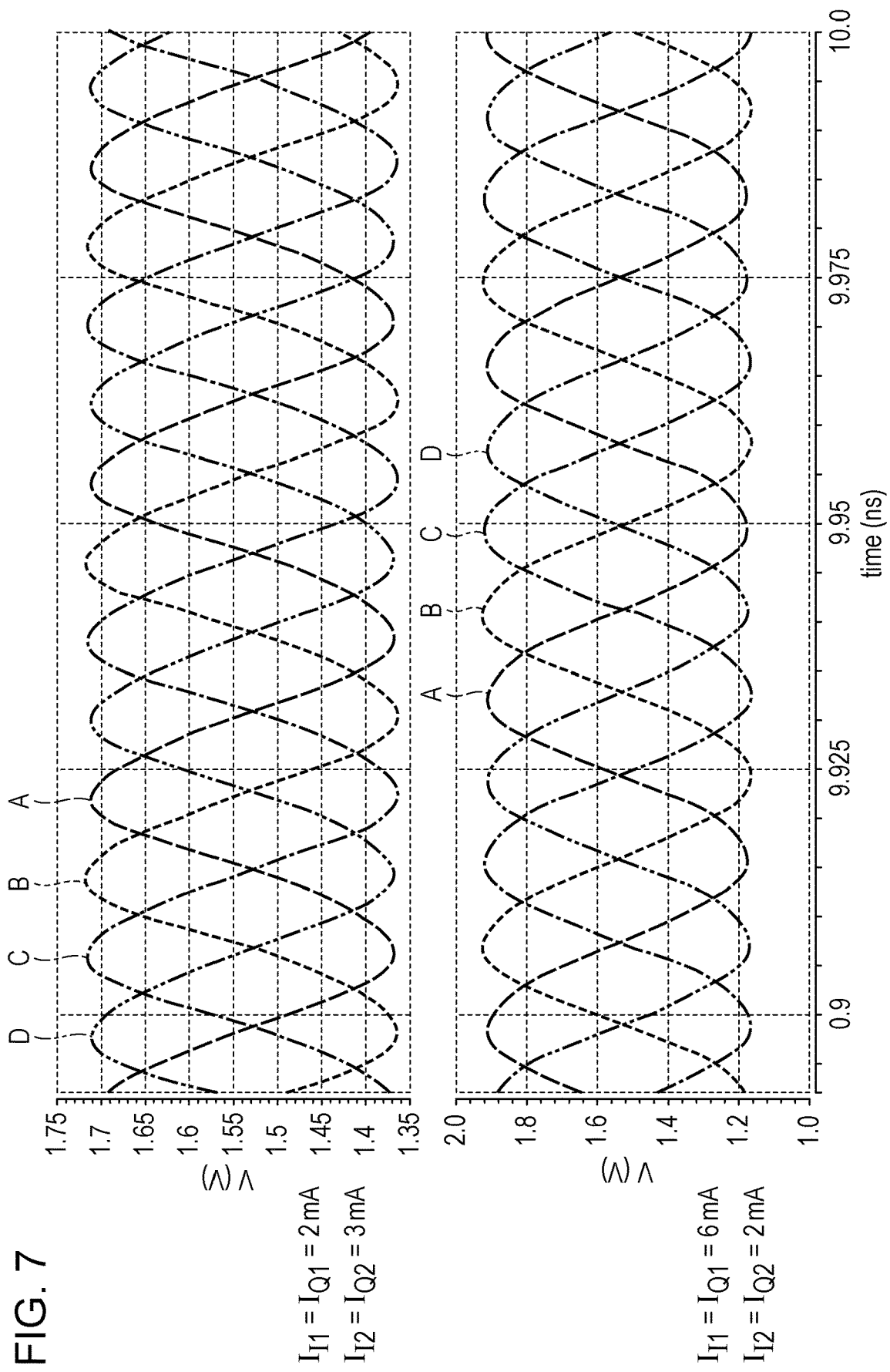
FIG. 7 is a time chart illustrating examples of changes in frequency of first and second differential signals outputted from the four-phase oscillator according to a second embodiment.

FIG. 7 illustrates examples of waveforms obtained by varying the tail current values in the second embodiment when the resonant frequency of the first resonator is equal to that of the second resonator. The upper diagram of FIG. 7 illustrates the waveforms in the rotation mode 2, in which the four-phase oscillator 41 oscillates at 31.1 GHz. The lower diagram of FIG. 7 illustrates waveforms in the rotation mode 1, in which the four-phase oscillator 41 oscillates at 29.3 GHz. The difference in frequency between the rotation modes 1 and 2 is 2.2 GHz. According to the four-phase oscillator of the disclosure, the four-phase oscillator is capable of addressing a plurality of oscillation frequencies alone, allowing for reduction of a decrease in the Q factor and expansion of the oscillation frequency range.

(Other Circuit Configuration of Four-phase Oscillator)

Figure 8:
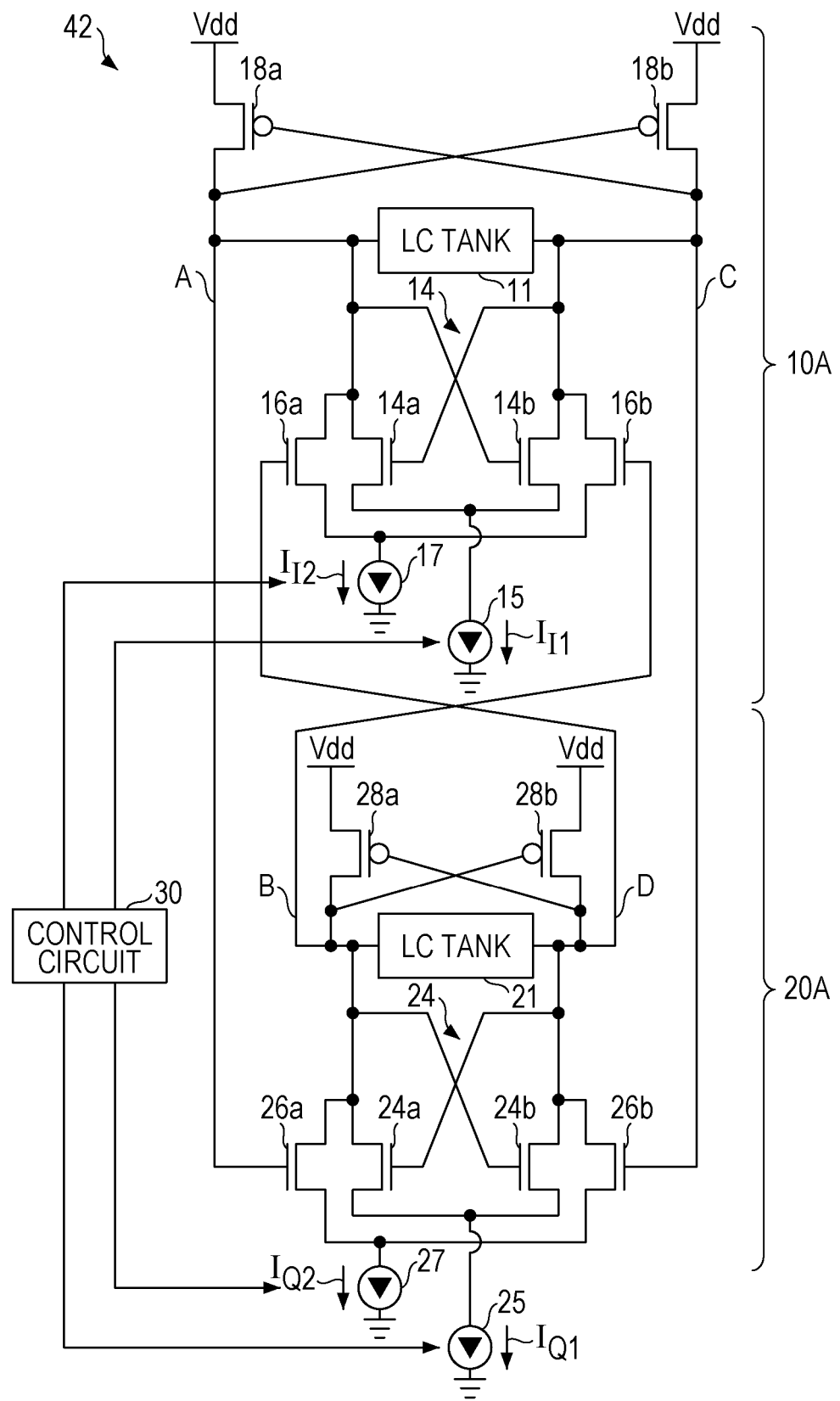
FIG. 8 is a diagram illustrating an example of another circuit configuration of the four-phase oscillator according to the disclosure.
Figure 9:
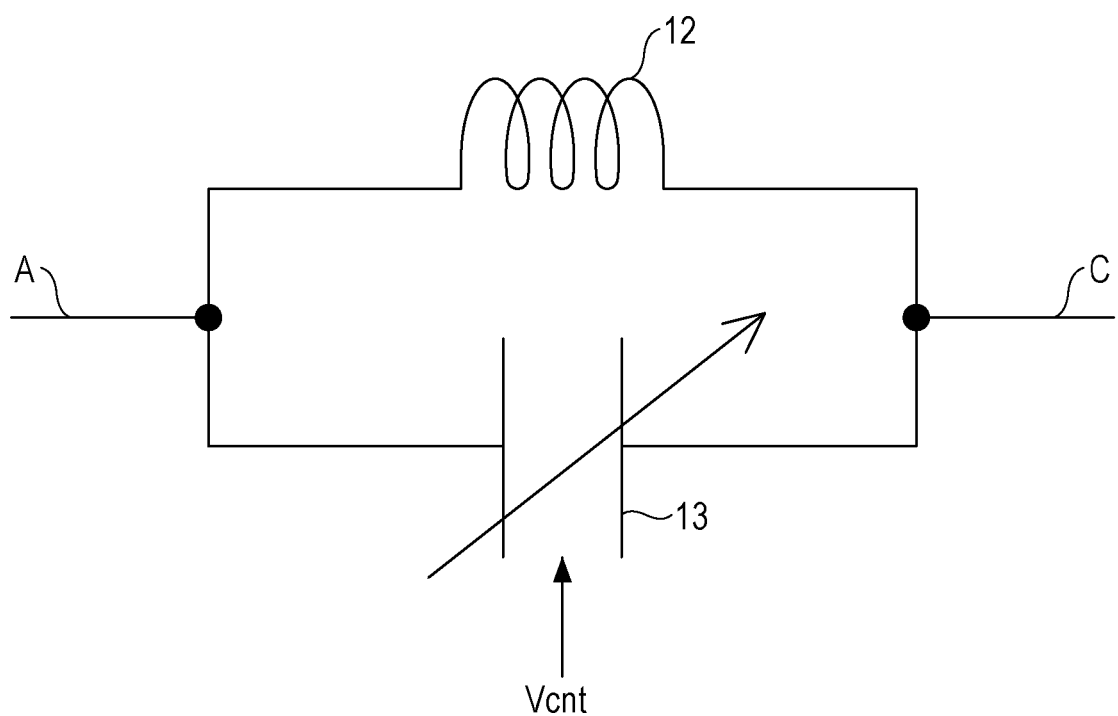
FIG. 9 is a diagram illustrating an example of the configuration of a resonator.

FIG. 8 is a diagram illustrating an example of another circuit configuration of the four-phase oscillator according to the disclosure. FIG. 9 is a diagram illustrating an example of the configuration of the LC tanks 11 and 21 included in a four-phase oscillator 42 illustrated in FIG. 8. In FIG. 8, the inductor in each LC tank is not coupled to the supply line (see FIG. 2) of the supply voltage Vdd. The four-phase oscillator 42 includes: an I-phase oscillator 10A, in which cross-coupled transistors 18a and 18b are coupled to the LC tank 11; and a Q-phase oscillator 20A, in which cross-coupled transistors 28a and 28b are coupled to the LC tank 21. The output terminals A to D are respectively coupled to supply lines of the supply voltage Vdd through the transistors 18a, 18b, 28a, and 28b so that the amplitude of each of the clock signals outputted from the output terminals A to D does not exceed the power supply voltage Vdd.

The gate of the transistor 18a is coupled to the second output terminal C; the drain thereof is coupled to the first output terminal A; and the source thereof is coupled to the supply line of the supply voltage Vdd. The gate of the transistor 18b is coupled to the first output terminal A; the drain thereof is coupled to the second output terminal C; and the source thereof is coupled to the supply line of the supply voltage Vdd.

The gate of the transistor 28a is coupled to the fourth output terminal D; the drain thereof is coupled to the third output terminal B; and the source thereof is coupled to the supply line of the supply voltage Vdd. The gate of the transistor 28b is coupled to the third output terminal B; the drain thereof is coupled to the fourth output terminal D; and the source thereof is coupled to the supply line of the supply voltage Vdd.

Each of the transistors 18a, 18b, 28a, and 28b is a P-channel MOSFET. Each of these transistors may be a pnp-type bipolar transistors. In this case, the gate, drain, and source correspond to the base, collector, and emitter, respectively.

(CDR Circuit)

Figure 10:
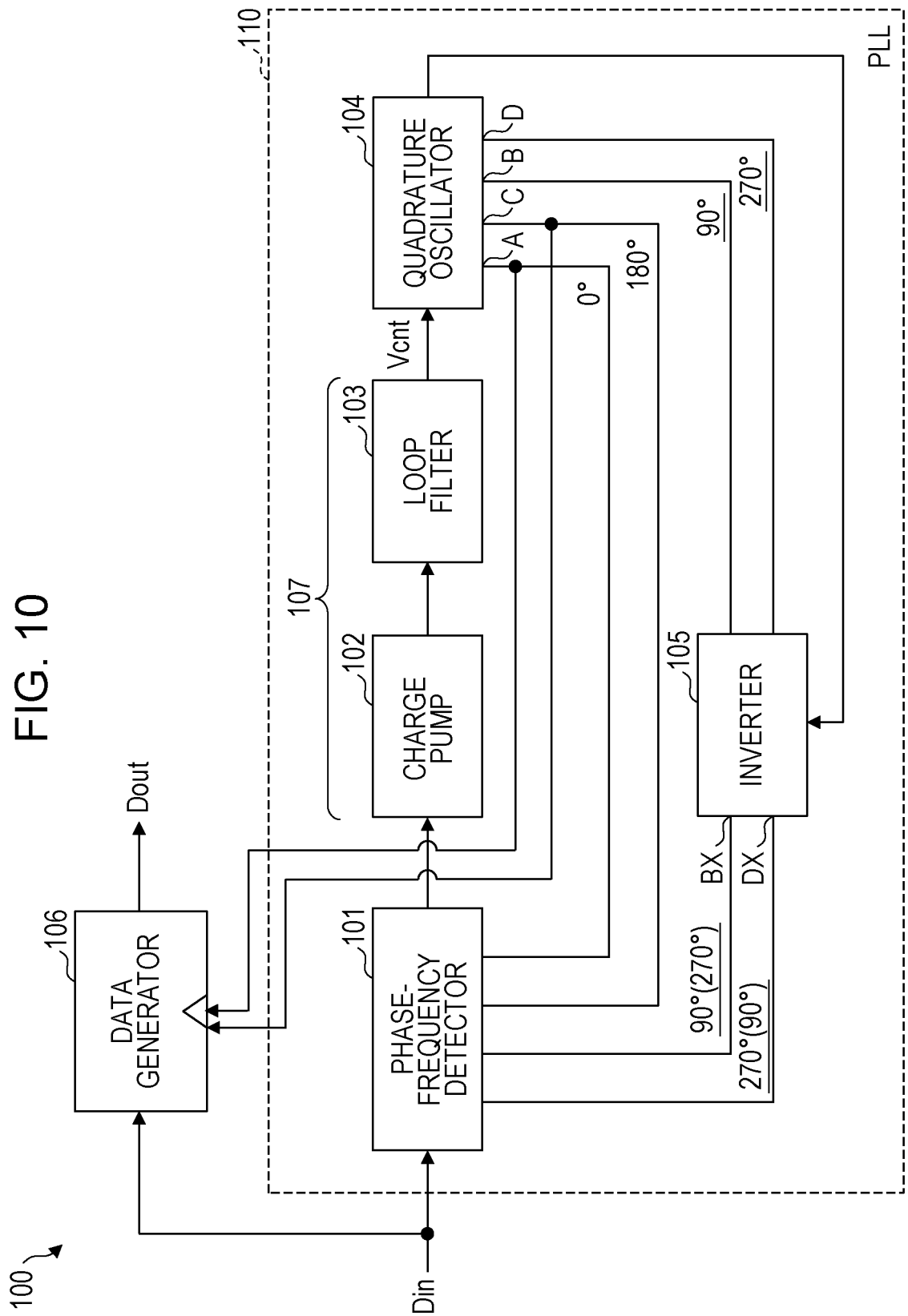
FIG. 10 is a diagram illustrating an example of the configuration of a CDR circuit according to the disclosure.

FIG. 10 is a diagram illustrating an example of the configuration of a CDR circuit according to the disclosure. A CDR circuit 100 regenerates clock signals and data Dout from received data signal Din with the clock signals superimposed thereon. The CDR circuit 100 includes a phase locked loop (PLL) circuit 110 and a data generator 106. The PLL circuit 110 includes a four-phase oscillator 104, an inverter 105, a phase-frequency detector 101, and a control voltage generator 107. The four-phase oscillator 104 may be the four-phase oscillator according to the disclosure. The control voltage generator 107 includes a charge pump 102 and a loop filter 103.

The four-phase oscillator 104 includes the same configuration (the I-phase oscillator 10, Q-phase oscillator 20, and control circuit 30) as that of the four-phase oscillator 41 illustrated in FIG. 1, for example. The I-phase oscillator 10 outputs first differential signals (0- and 180-degree clock signals) through the paired output terminals A and C. The Q-phase oscillator 20 outputs second differential signals (90- and 270-degree clock signals) through the paired output terminals B and D.

The inverter 105 is a circuit configured to output third differential signals obtained by inverting the phase of the second differential signals outputted from the output terminals B and D.

The phase-frequency detector 101 uses the first and third differential signals to compare the phase of the received data signal Din with the phase of the first differential signals. The phase-frequency detector 101 also uses the first and third differential signals to compare the frequency of the received data signal Din with the frequency of the first differential signals.

The phase-frequency detector 101 generates a phase detection signal PDI, which indicates the result of comparison between the phase of the received data signal Din and the phase of the first differential signals, and a frequency detection signal FDO, which indicates the result of comparison between the frequency of the received data signal Din and the frequency of the first differential signals. The phase-frequency detector 101 outputs the generated phase detection signal PDI and frequency detection signal FDO to the charge pump 102.

Figure 11:
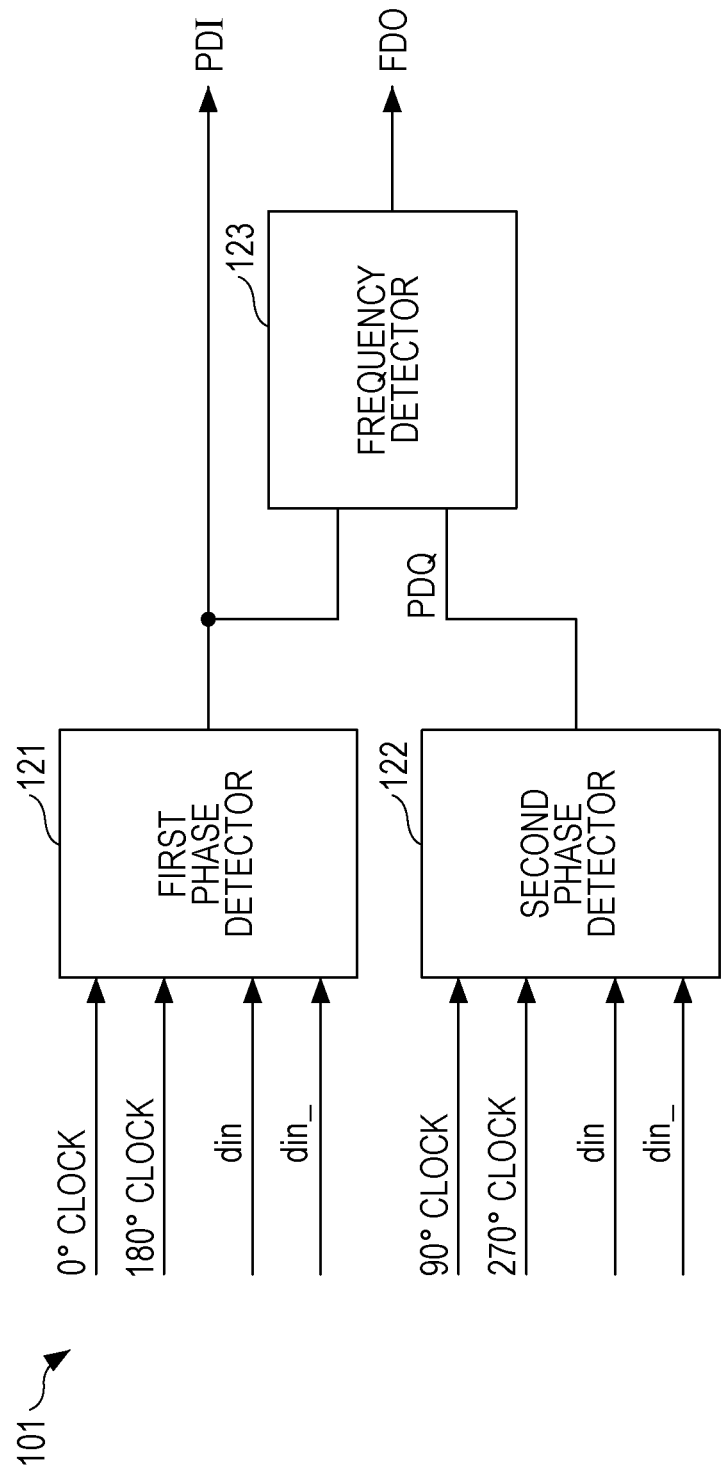
FIG. 11 is a diagram illustrating an example of the configuration of a phase-frequency detector.

FIG. 11 is a diagram illustrating an example of the configuration of the phase-frequency detector. The phase-frequency detector 101 includes a first phase detector 121, a second phase detector 122, and a frequency detector 123. The first phase detector 121, second phase detector 122, and frequency detector 123 may be composed of a configuration described in A. Pottbacker, et al., "A Si Bipolar Phase and Frequency Detector IC for Clock Extraction up to 8 Gb/2", IEEE Journal of Solid-State Circuits, Vol. 27, No. 12, pp. 1747-1751, 1992 (Non-patent Literature 1), for example. Non-patent Literature 1 describes differential first and second phase detectors each composed of two sample hold circuits (latch circuits) and a multiplexer. Non-patent Literature 1 also describes a differential frequency detector composed of two latch circuits and a modified multiplexer.

The received data signal Din inputted into the phase-frequency detector 101 includes differential data signals din and din_, which are opposite in phase. The first phase detector 121 outputs the first phase detection signal PDI corresponding to the phase difference between the received data signal din and the first differential signals. Specifically, the first phase detector 121 generates the first phase detection signal PDI indicating whether edges of the first differential signals (0- and 180-degree clock signals) lead or lag behind edges of the differential data signals din and din_. The second phase detector 122 outputs the second phase detection signal PDQ corresponding to the phase difference between the received data signal Din and the second differential signals. Specifically, the second phase detector 122 generates the second phase detection signal PDQ indicating whether edges of the second differential signals (90- and 270-degree clock signals) lead or lag behind edges of the differential data signals din and din_.

The frequency detector 123 generates the frequency detection signal FDO from the direction of the edges of the phase detection signal PDI and the value of the phase detection signal PDQ latched by the edges of the phase detection signal PDI. The frequency detection signal FDO indicates whether the frequency of the first differential signals is lower than the frequency of the received data signal Din. The frequency detection signal FDO indicates +1 when the frequency of the first differential signals is lower than the frequency of the received data signal Din; −1, when higher than the frequency of the received data signal Din; and 0, when equal to the frequency of the received data signal Din. The phase detection signal PDI and frequency detection signal FDO are supplied to the charge pump 102 (see FIG. 10).

The charge pump 102 uses the phase detection signal PDI and frequency detection signal FDO supplied from the phase-frequency detector 101 to generate a signal to compensate the phase difference and frequency difference between the received data signal Din and the first differential signals. The charge pump 102 outputs an up signal Up to the loop filter 103 when determining that the phase of the first differential signals lags behind the phase of the received data signal Din or the frequency of the first differential signals is lower than the frequency of the received data signal Din. On the other hand, the charge pump 102 outputs a down signal Down to the loop filter 103 when determining that the phase of the first differential signals leads the phase of the received data signal Din or the frequency of the first differential signals is higher than the frequency of the received data signal Din.

The loop filter 103 supplies the control voltage Vcnt to adjust the frequency and phase of the first and second differential signals to the LC tanks 11 and 21 in the four-phase oscillator 104. The control voltage Vcnt enables fine adjustment of the frequency and phase of the first and second differential signals.

The loop filter 103 changes the control voltage Vcnt to be supplied to the four-phase oscillator 104 in accordance with the up signal Up and down signal Down supplied from the charge pump 102. Upon supplied with the up signal Up from the charge pump 102, the loop filter 103 raises the control voltage Vcnt to be supplied to the four-phase oscillator 104. Raising the control voltage Vcnt advances the phase of the first differential signals and increases the frequency of the first differential signals. Upon supplied with the down signal Down from the charge pump 102, the loop filter 103 reduces the control voltage Vcnt to be supplied to the four-phase oscillator 104. Reducing the control voltage Vcnt delays the phase of the first differential signals and reduces the frequency of the first differential signals.

The four-phase oscillator 104 generates first differential signals with the frequency and phase finely adjusted in accordance with the control voltage Vcnt supplied from the loop filter 103 and the second differential signals obtained by inverting the phase of the first differential signals.

The data generator 106 is a data flip-flop, for example. The data generator 106 samples the received data signal Din in accordance with the first differential signals outputted from the four-phase oscillator 104 to regenerate data Dout from the received data signal Din.

Figure 12:
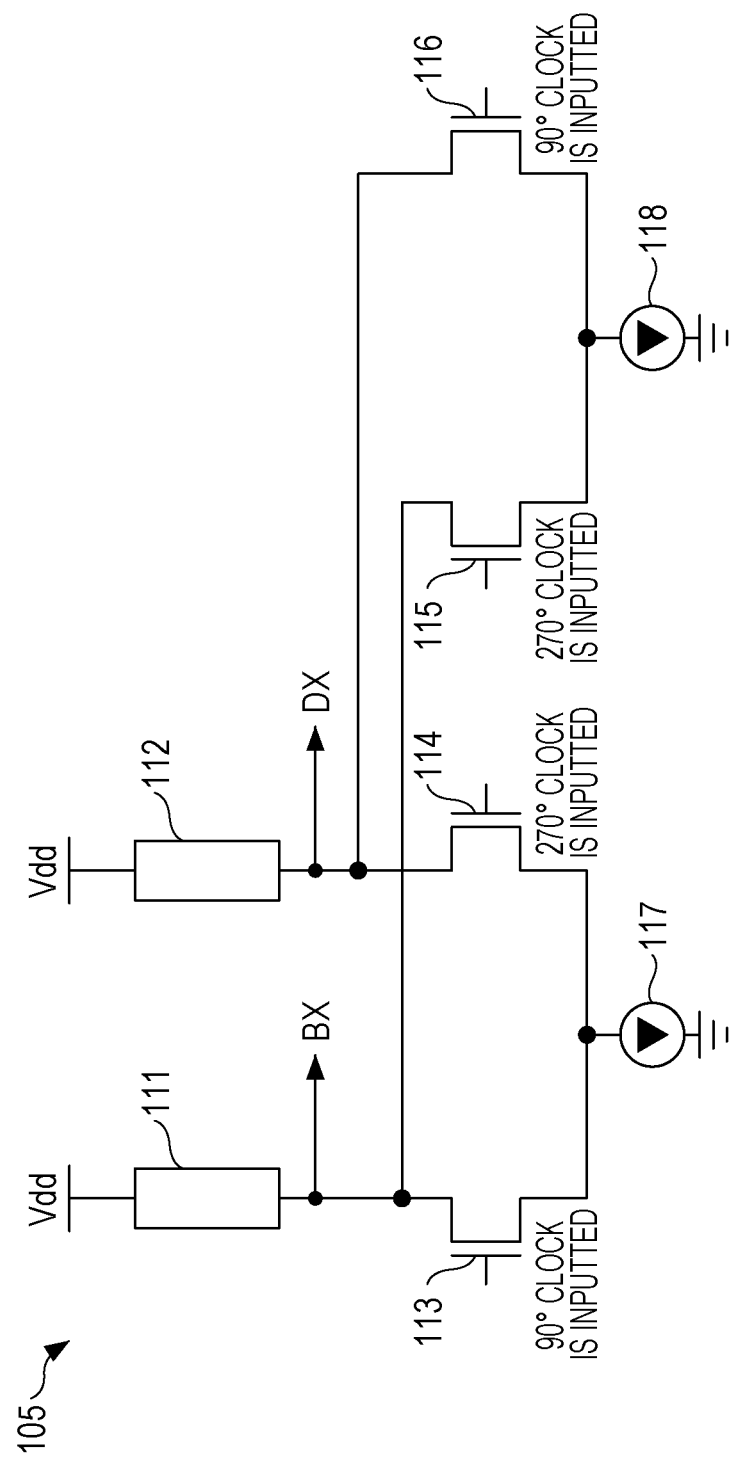
FIG. 12 is a diagram illustrating an example of the configuration of an inverter.

FIG. 12 is a diagram illustrating an example of the configuration of the inverter. The inverter 105 includes load resistors 111 and 112, N-channel transistors 113 to 116, and constant current sources 117 and 118. The gates of the transistors 113 and 116 are supplied with 90-degree clock signal outputted from the output terminal B, and the gates of the transistors 114 and 115 are supplied with the 270-degree clock signal outputted from the output terminal D. The drains of the transistors 113 and 115 are coupled to the supply line of the supply voltage Vdd through the load resistor 111, and the drains of the transistors 114 and 116 are coupled to the supply line of the supply voltage Vdd through the load resistor 112. The sources of the transistors 113 and 114 are coupled to the ground through the constant current source 117, and the sources of the transistors 115 and 116 are coupled to the ground through the constant current source 118.

The inverter 105 activates one of the constant current sources 117 and 118 based on the control signal to switch the rotation mode supplied from the control circuit 30 of the four-phase oscillator 104. The phase of the second differential signals (the phase of the 90- and 270-degree clock signals) is inverted in synchronization with switching of the rotation mode of the four-phase oscillator 104 by the control circuit 30. The phase of the entire CDR loop of the CDR circuit 100 does not change when the process of switching the rotation mode, which changes the frequency of the first and second differential signals, is performed. This reduces the risk of malfunctions of the CDR circuit 100 at the process of switching the rotation mode.

When receiving the control signal to switch the oscillation mode of the four-phase oscillator 104 from the rotation mode 1 to the rotation mode 2, the inverter 105 turns on the constant current source 117 and turns off the constant current source 118. The 90-degree clock signal inputted to the transistor 113 is thereby supplied through the transistor 113 and a terminal BX to the phase-frequency detector 101. The 270-degree clock signal inputted to the transistor 114 is supplied through the transistor 114 and a terminal DX to the phase-frequency detector 101.

When receiving the control signal to switch the oscillation mode of the four-phase oscillator 104 from the rotation mode 2 to the rotation mode 1, the inverter 105 turns on the constant current source 118 and turns off the constant current source 117. The 90-degree clock signal inputted to the transistor 116 is thereby supplied through the transistor 116 and the terminal DX to the phase-frequency detector 101. The 270-degree clock signal inputted to the transistor 115 is supplied through the transistor 115 and the terminal BX to the phase-frequency detector 101.

It is therefore possible to reduce the risk of malfunctions of the phase-frequency detector 101 even if switching of the rotation mode, which changes the frequency of the first and second differential signals, is performed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A clock and data recovery circuit comprising:
   a first oscillator configured to output a first differential signal, the first oscillator including
      a first resonator including an inductor and a capacitor coupled in parallel,
      a first cross-coupled circuit in which a first pair of transistors coupled to the first resonator are cross-coupled,
      a first tail current source coupled to the first pair of transistors,
      first input differential pair transistors configured to receive a second differential signal, and
      a second tail current source coupled to the first input differential pair transistors;
   a second oscillator configured to output the second differential signal shifted in phase with respect to the first differential signal by 90 or −90 degrees, the second oscillator including
      a second resonator including an inductor and a capacitor coupled in parallel,
      a second cross-coupled circuit in which a second pair of transistors coupled to the second resonator are cross-coupled,
      a third tail current source coupled to the second pair of transistors,
      second input differential pair transistors configured to receive the first differential signal, and
      a fourth tail current source coupled to the second input differential pair transistors;
   a control circuit configured to control, based on which of a first resonant frequency at which the first resonator resonates and a second resonant frequency at which the second resonator resonates is higher, at least one of a difference between a first current value supplied from the first tail current source and a third current value supplied from the third tail current source and a difference between a second current value supplied from the second tail current source and a fourth current value supplied from the fourth tail current source;
   an inverter configured to output a third differential signal inverted the phase of the second differential signal based on the change of the frequency by the control circuit;
   a first phase detect circuit configured to output a first phase detect signal based on a difference between a received data signal and the first differential signal;
   a second phase detect circuit configured to output a second phase detect signal based on a difference between a received data signal and the second differential signal;
   a frequency detect circuit configured to compare the first phase detect signal with the second phase detect signal, and output a frequency detect signal based on a difference between the received signal and the first differential signal;
   a control voltage generation circuit configured to generate a control voltage to adjust frequencies and phases of the first differential signal and the second differential signal based on the first phase detect signal and the frequency detect signal; and
   a data generation circuit configured to regenerate data from the received data according to the first differential signal.

2. The clock and data recovery circuit according to claim 1, wherein the first resonant frequency at which the first resonator resonates is different from the second resonant frequency at which the second resonator resonates.

3. The clock and data recovery circuit according to claim 2, wherein
   when the first resonant frequency is higher than the second resonant frequency, the control circuit sets the first current value higher than the third current value and sets the second current value higher than the fourth current value and sets the first current value lower than the third current value and sets the second current value lower than the fourth current value, and when the first resonant frequency is lower than the second resonant frequency, the control circuit sets the first current value lower than the third current value and sets the second current value lower than the fourth current value and sets the first current value higher than the third current value and sets the second current value higher than the fourth current value.

4. A clock and data recovery circuit comprising:
a first oscillator configured to output a first differential signal, the first oscillator including
  a first resonator including an inductor and a capacitor coupled in parallel,
  a first cross-coupled circuit in which a first pair of transistors coupled to the first resonator are cross-coupled,
  a first tail current source coupled to the first pair of transistors,
  first input differential pair transistors configured to receive a second differential signal, and
  a second tail current source coupled to the first input differential pair transistors;
a second oscillator configured to output the second differential signal shifted in phase with respect to the first differential signal by 90 or −90 degrees, the second oscillator including
  a second resonator including an inductor and a capacitor coupled in parallel,
  a second cross-coupled circuit in which a second pair of transistors coupled to the second resonator are cross-coupled,
  a third tail current source coupled to the second pair of transistors,
  second input differential pair transistors configured to receive the first differential signal, and
  a fourth tail current source coupled to the second input differential pair transistors;
a control circuit configured to control, based on a first resonant frequency at which the first resonator resonates and a second resonant frequency at which the second resonator resonates, at least one of a difference between a first current value supplied from the first tail current source and a second current value supplied from the second tail current source and a difference between a third current value supplied from the third tail current source and a fourth current value supplied from the fourth tail current source;
an inverter configured to output a third differential signal inverted the phase of the second differential signal based on the change of the frequency by the control circuit;
a first phase detect circuit configured to output a first phase detect signal based on a difference between a received data signal and the first differential signal;
a second phase detect circuit configured to output a second phase detect signal based on a difference between a received data signal and the second differential signal;
a frequency detect circuit configured to compare the first phase detect signal with the second phase detect signal, and output a frequency detect signal based on a difference between the received signal and the first differential signal;

a control voltage generation circuit configured to generate a control voltage to adjust frequencies and phases of the first differential signal and the second differential signal based on the first phase detect signal and the frequency detect signal; and
a data generation circuit configured to regenerate data from the received data according to the first differential signal.

5. The clock and data recovery circuit according to claim 4, wherein when the control circuit performs at least one of setting the first current value higher than the second current value and setting the third current value higher than the fourth current value and performs at least one of setting the second current value higher than the first current value and setting the fourth current value higher than the third current value.

6. The clock and data recovery circuit according to claim 4, wherein the first input differential pair transistors are coupled in parallel to the first pair of transistors and the second input differential pair transistors are coupled in parallel to the second pair of transistors.

7. The clock and data recovery circuit according to claim 6, wherein
  the first resonator is coupled between a first output terminal and a second output terminal,
  the second resonator is coupled between a third output terminal and a fourth output terminal,
  the first pair of transistors include a first transistor coupled to the first output terminal and a second transistor coupled to the second output terminal,
  the first input differential pair transistors include a third transistor which is coupled in parallel to the first transistor and is coupled to the fourth output terminal and a fourth transistor which is coupled in parallel to the second transistor and is coupled to the third output terminal,
  the second pair of transistors include a fifth transistor coupled to the third output terminal and a sixth transistor coupled to the fourth output terminal, and
  the second input differential pair transistors include a seventh transistor which is coupled in parallel to the fifth transistor and is coupled to the first output terminal and an eighth transistor which is coupled in parallel to the sixth transistor and is coupled to the second output terminal.

8. A clock and data recovery circuit comprising:
a four-phase oscillator configured to output a first differential signal and a second differential signal shifted in phase with respect to the first differential signal by 90 or −90 degrees, the four-phase oscillator including
  a first oscillator configured to output a first differential signal, the first oscillator including
    a first resonator including an inductor and a capacitor coupled in parallel,
    a first cross-coupled circuit in which a first pair of transistors coupled to the first resonator are cross-coupled,
    a first tail current source coupled to the first pair of transistors,
    first input differential pair transistors configured to receive a second differential signal, and
    a second tail current source coupled to the first input differential pair transistors;
  a second oscillator configured to output the second differential signal shifted in phase with respect to the first differential signal by 90 or −90 degrees, the second oscillator including a second resonator including an inductor and a capacitor coupled in parallel,
a second cross-coupled circuit in which a second pair of transistors coupled to the second resonator are cross-coupled,
a third tail current source coupled to the second pair of transistors,
second input differential pair transistors configured to receive the first differential signal, and
a fourth tail current source coupled to the second input differential pair transistors; and
a control circuit configured to change the frequency of the first and second differential signals by controlling at least one of a difference between a first current value supplied from the first tail current source and a third current value supplied from the third tail current source and a difference between a second current value supplied from the second tail current source and a fourth current value supplied from the fourth tail current source
an inverter configured to output a third differential signal inverted the phase of the second differential signal based on the change of the frequency by the control circuit;
a first phase detect circuit configured to output a first phase detect signal based on a difference between a received data signal and the first differential signal;
a second phase detect circuit configured to output a second phase detect signal based on a difference between a received data signal and the second differential signal;
a frequency detect circuit configured to compare the first phase detect signal with the second phase detect signal, and output a frequency detect signal based on a difference between the received signal and the first differential signal;
a control voltage generation circuit configured to generate a control voltage to adjust frequencies and phases of the first differential signal and the second differential signal based on the first phase detect signal and the frequency detect signal;
a data generation circuit configured to regenerate data from the received data according to the first differential signal.

9. A clock and data recovery circuit comprising:
a four-phase oscillator configured to output a first differential signal and a second differential signal shifted in phase with respect to the first differential signal by 90 or −90 degrees, the four-phase oscillator including
a first oscillator configured to output a first differential signal, the first oscillator including
a first resonator including an inductor and a capacitor coupled in parallel,
a first cross-coupled circuit in which a first pair of transistors coupled to the first resonator are cross-coupled,
a first tail current source coupled to the first pair of transistors,
first input differential pair transistors configured to receive a second differential signal, and
a second tail current source coupled to the first input differential pair transistors;
a second oscillator configured to output the second differential signal shifted in phase with respect to the first differential signal by 90 or −90 degrees, the second oscillator including
a second resonator including an inductor and a capacitor coupled in parallel,
a second cross-coupled circuit in which a second pair of transistors coupled to the second resonator are cross-coupled,
a third tail current source coupled to the second pair of transistors,
second input differential pair transistors configured to receive the first differential signal, and
a fourth tail current source coupled to the second input differential pair transistors, and
a control circuit configured to change the frequency of the first and second differential signals by controlling at least one of a difference between a first current value supplied from the first tail current source and a second current value supplied from the second tail current source and a difference between a third current value supplied from the third tail current source and a fourth current value supplied from the fourth tail current source;
an inverter configured to output a third differential signal inverted the phase of the second differential signal based on the change of the frequency by the control circuit;
a first phase detect circuit configured to output a first phase detect signal based on a difference between a received data signal and the first differential signal;
a second phase detect circuit configured to output a second phase detect signal based on a difference between a received data signal and the second differential signal;
a frequency detect circuit configured to compare the first phase detect signal with the second phase detect signal, and output a frequency detect signal based on a difference between the received signal and the first differential signal;
a control voltage generation circuit configured to generate a control voltage to adjust frequencies and phases of the first differential signal and the second differential signal based on the first phase detect signal and the frequency detect signal;
a data generation circuit configured to regenerate data from the received data according to the first differential signal.

* * * * *